United States Patent [19]

Norton et al.

[11] 4,153,005

[45] May 8, 1979

[54] MULTIPLE ELECTRON BEAM VACUUM VAPOR DEPOSITION APPARATUS

[75] Inventors: Delwyn E. Norton, Manchester, Conn.; Edward W. Taylor, Richland, Wash.

[73] Assignee: United Technologies Corporation, Hartford, Conn.

[21] Appl. No.: 813,397

[22] Filed: Jul. 6, 1977

[51] Int. Cl.$^2$ ............................................. C23C 13/12
[52] U.S. Cl. ................................... 118/49.1; 118/624
[58] Field of Search ........................ 118/48, 49.1, 49.5, 118/50.1, 624, 625; 427/47; 219/121 EB

[56] References Cited

U.S. PATENT DOCUMENTS

| | | | |
|---|---|---|---|
| 3,189,953 | 6/1965 | Smith, Jr. | 219/121 EB |
| 3,268,648 | 8/1966 | Dietrich | 219/121 EB |
| 3,364,296 | 1/1968 | Smith, Jr. | 118/49.1 UX |
| 3,420,977 | 1/1969 | Hanks et al. | 219/121 EB |
| 3,450,824 | 6/1969 | Hanks et al. | 219/121 EB |
| 3,526,206 | 9/1970 | Jones | 118/49.1 |
| 3,556,048 | 1/1971 | Paine | 118/49.5 |
| 3,777,704 | 12/1973 | Van Poucke | 118/49.1 |
| 3,889,019 | 6/1975 | Blecherman et al. | 188/49.5 X |
| 4,016,389 | 4/1977 | White | 118/49.1 X |

*Primary Examiner*—Wm. Cater Reynolds
*Attorney, Agent, or Firm*—Edward J. Timmer; Charles G. Nessler

[57] ABSTRACT

A vacuum vapor deposition apparatus having a plurality of electron beam sources spaced about the periphery of the molten alloy pool is provided. The electron beam sources have associated therewith focusing and deflection devices for directing each electron beam onto the pool surface opposite its source in the form of an inwardly curved impingement band. These create an approximate toroidal shaped heating pattern to the pool, this pattern providing uniform temperature and minimizing severe thermal gradients therein. As a result, variations in the chemistry of the vapor emanating from the pool are substantially reduced, thereby providing improved control of the as-deposited coating composition. The apparatus is especially useful in vaporizing alloys of complex chemistry, such as coating alloys in the MCrAlY family.

5 Claims, 6 Drawing Figures

U.S. Patent
May 8, 1979
4,153,005
FIG. 1
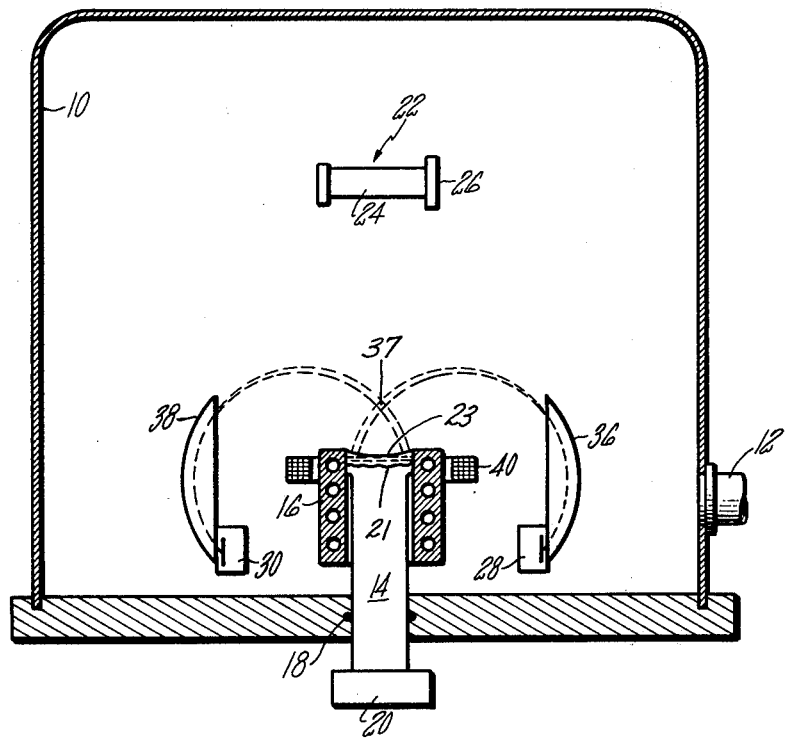
FIG. 2
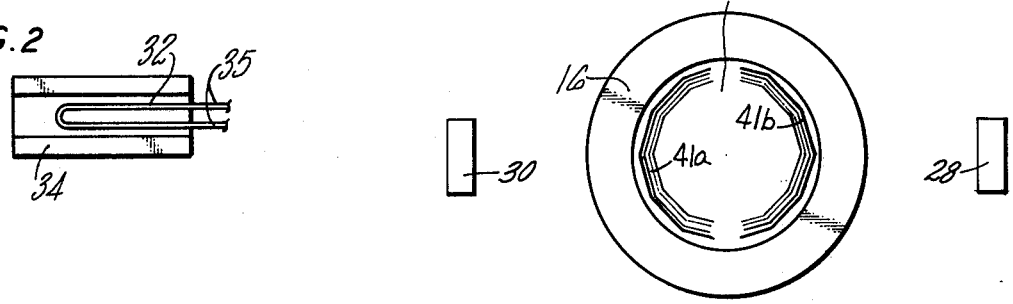
FIG. 4
FIG. 3b
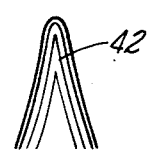
FIG. 3a
FIG. 5
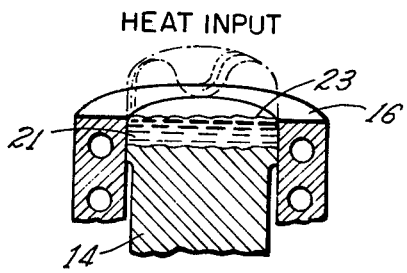

MULTIPLE ELECTRON BEAM VACUUM VAPOR DEPOSITION APPARATUS

BACKGROUND OF THE INVENTION

1. Field of the Invention

The present invention relates in general to coating apparatus, and more particularly, to apparatus for the electron beam vacuum vapor deposition of alloys of complex chemistry.

2. Description of the Prior Art

It has become increasingly important, particularly in certain gas turbine engine applications, to provide protective coatings on selected components such as turbine blades. Typical of coating alloys in wide use in gas turbine engines are the so-called MCrAlY coating alloys described in U.S. Pats. Nos. 3,542,530; 3,676,085; 3,754,903 and 3,928,026. One commonly used technique for applying these coating alloys to turbine components is by vacuum vapor deposition in which the substrate is exposed to vapors emanating from a molten pool of the coating alloy in a suitable vacuum chamber. Vaporization from the surface of the molten pool is effected by impinging an electron beam onto the surface of the pool. However, where high energy electron beams are utilized, serious problems arise in the form of severe thermal gradients in the pool which have been found to contribute significantly to chemistry variations in the vapor cloud and the as-deposited coating. The problem is aggravated when MCrAlY coating alloys are vaporized as a result of the elemental constituents of the coating alloys having widely differing melting points and vapor pressures under the coating conditions. One attempt to minimize chemistry variations in the as-deposited coating is represented by the Greaves patent, U.S. Pat. No. 3,655,430. Others may also include U.S. Pat. Nos. 3,205,087; 3,590,777 and 3,639,151.

SUMMARY OF THE INVENTION

The present invention provides an improved apparatus for electron beam vacuum vapor deposition. The apparatus is particularly useful in vaporizing and depositing alloys of complex chemistry such as the family of MCrAlY coating alloys.

An important advantage of the invention is that the heat input electron beams across the surface of the alloy pool is more uniform than has been heretofore achievable, resulting in a substantial reduction in harmful thermal gradients in the pool and a corresponding reduction in chemistry variations in the vapor cloud and the as-deposited coating. Another important advantage which results from improved energy distribution is that subsurface boiling of the pool and explosive spitting of the molton alloy are also significantly reduced.

Briefly, the invention envisions the placement of a plurality of electron beam sources about the periphery of the molten alloy pool, the sources having focusing and deflection means associated therewith for directing impingement of each electron beam adjacent to the circumference of the pool surface opposite its source in the form of an inwardly curved band. The curved bands, representing the paths of impingement of the beams, are located on the pool surface such that collectively they create an approximate toroidal shaped heat input pattern to the pool. The toroidal shaped heat input pattern is defined in conjunction with the preferred embodiment description. This heating pattern provides uniform temperature of the pool and the advantages enumerated hereinabove.

In a particular preferred embodiment, two electron beam sources are spaced 180° apart around the periphery of the pool and each electron beam is directed onto the pool surface opposite its source to provide the toroidal shaped heating pattern in the pool, the electron beams crossing paths at some point above the pool.

These and other advantages and objects of the invention will become more fully apparent from the following drawings and detailed description of the preferred embodiment.

BRIEF DESCRIPTION OF THE DRAWINGS

FIG. 1 is a simplified, somewhat schematic view of the apparatus of the invention.

FIG. 2 is a schematic elevation view of a linear electron beam emitter useful in the apparatus.

FIGS. 3a and 3b are top views of the beam impingement spot with and without the alternating current coil winding in operation.

FIG. 4 is a fragmentary top view showing inwardly curved band of the beam impingement on the molten pool surface produced by the apparatus of FIG. 1.

FIG. 5 is a partial sectional view of the apparatus showing the toroidal heat input pattern.

DESCRIPTION OF THE PREFERRED EMBODIMENT

In one particular embodiment of the invention as illustrate in FIG. 1, there is shown a vacuum chamber 10 having an exit port 12 leading to a suitable high-vacuum pump, preferably of the diffusion type, for the rapid and continuous evacuation of the chamber. A cylindrical ingot 14 of the coating alloy, for example, an ingot of the MCrAlY composition when M is selected from the group consisting of nickel, cobalt and iron, is made movable and is slidably received at its upper end by an annular water-cooled crucible 16. The ingot is normally continuously fed upwardly into the crucible through a heat-resistant vacuum seal 18 in the chamber wall at a controlled rate by a chuck 20 to maintain a constant molten pool 21 height. In this way, the focused electron beams will impinge only on the desired pool 23 area. Furthermore, since coating efficiency, composition and uniformity are susceptible to pool height changes, a constant height relationship between the pool and part to be coated is preferred.

The substrate to be coated is disposed within the vacuum chamber 10 vertically above the moltin pool atop the ingot 14 and is illustrted as a gas turbine blade 22 having an airfoil section 24 and shroud section 26. Since the coating process is fundamentally line-of-sight, the part is typically mounted to effect rotation about its longitudinal axis, that is, the longitudinal axis of the airfoil section 24, utilizing a pass-through suspension rod (not shown) through the vacuum chamber to an external drive system. The substrate is positioned as close as possible to the surface of the molten alloy pool for maximum coating efficiency but far enough therefrom to prevent coating contamination by splash or spitting from the pool. The substrate height varies for each system but for a 4 inch diameter molten pool and a deposition rate of about 35 mils per minute with an MCrAlY coating alloy, a mean height of about 7 to 8 inches has been found satisfactory. Of course, more than one substrate may be coated at one time in the vacuum chamber.

According to the invention, two electron beam sources in the form of linear emitters 28 and 30 are disposed about the periphery of the molten pool contained within the crucible. A typical linear emitter found satisfactory in vaporizing MCrAlY coating alloys is shown in FIG. 2, and includes a U-shaped filament 32 and cathode body 34, the filament being heated directly by connecting end terminals 35 to a suitable power source (not shown). In vaporizing MCrAlY alloys, such an emitter typically draws about 5 amps of current at a voltage of about 10 K. Depending upon the particular circumstances, other conventional electron beam sources can also be used. As shown in dotted lines, the electron beams from emitters 28 and 30 are deflected approximately 270° so that the beams cross paths at some point 37 above the molten pool and impinge on the pool surface opposite the respective sources. Such deflection and focusing are accomplished by direct current electromagnets (so-called elephant ear magnets) 36 and 38 or other conventional devices. However, in addition to the direct current focusing and deflection means, the apparatus also includes alternating current deflection means in the form of coil winding 40 concentric with the crucible and molten pool. It has been found that the coil winding, when excited by alternating current such as at 60 Hz, causes the electron beam to impinge on the pool surface as an inwardly curved band 41 relative to its source, rather than a small spot 42, FIG. 3a and 3b. FIG. 3a and 3b illustrate this effect in that without the coil 40 excited, the electron beam impingement pattern on the pool surface appears as a small, narrow spot 42, FIG. 3b, whereas with the coil excited by alternating current, the beam pattern is shaped into a broad inwardly curved or arcuate band 41 relative to its source, for example, see FIG. 4 where electron beam impingement band 41a is inwardly curved relative to its source, emitter 28, and band 41b is inwardly curved relative to its source, emitter 30. when two electron beam emitters are spaced about the pool about 180° apart, the collective beam pattern on the pool surface is as shown in FIG. 4, thereby providing an approximate toroidal shaped heat input pattern in the pool. The collective beam pattern shown in FIG. 4 results in a heat input pattern particularly suited to carrying out the objects of the invention. The heat input pattern is characterized as being of an approximate toroidal pattern because of the appearance of a three dimensional graphical plot of the heat input with respect to points on the pool surface, as shown in FIG. 5. It is seen that along a diameter of the pool surface, the heat intensity curve is characterized by two maximum peaks separated by a central valley minimum. The maximum peaks are located near the ends of the diameter, their exact locations and the relative and absolute heights of the maximums and the central minimum being determined by experiment of a skilled operator to achieve uniform temperature and vaporization which is the object of the invention. Those skilled in the art will recognize that the heat input pattern referred to here is also approximate since with the conventional emitters and focusing means used in the apparatus, there is imprecise definition to the edges of the electron beams, and their resultant impingement areas. This toroidal type of heating pattern has been found to provide more uniform vaporization than has been heretofore obtainable. Severe thermal gradients in the molten pool can thus be significantly reduced by the present apparatus and that chemistry variations in the vapor emanating from the pool are consequently also significantly reduced. The net result is an as-deposited coating having reduced variation in its composition. Also, as a result of the more uniform temperature of the pool, explosive spitting from the pool due to localized overheating is also reduced. This may permit placement of the substrate closer to the surface of the pool to improve coating efficiency.

The following examples are offered to illustrate the effectiveness of the inventive apparatus. The data in Table I represent samples of the vapor cloud obtained by suspending flat plates over a molten CoCrAlY pool during vaporizaton whereas the data in Table II were obtained by affixing a sampling tab to turbine blades during coating with a CoCrAlY alloy. In each case, vaporization was conducted with a single linear emitter in accordance with prior art practice and with dual emitters spaced 180° apart as shown in FIG. 1.

TABLE I

| | Average Chromium Gradient through vapor cloud |
|---|---|
| Single emitter | 6.1% |
| Dual emitters | 1.8% |

TABLE II

| | Overall Chemistry Variance | |
|---|---|---|
| | Single Emitter | Dual Emitters |
| w/o Cr | 15.8–21.8=6% | 16.9–20.2=3.3% |
| w/o Al | 8.7–10.2=1.5% | 8.5–10.2=1.7% |
| w/o Y | 0.18–0.42=0.24% | 0.11–0.44=0.33% |

It is evident from this data that the chromium gradient in the vapor emanating from the molten CoCrAlY pool and being deposited on the substrate is reduced by at least about 50% when the apparatus of the invention is used while other constituents of the coating are maintained within acceptable limits. In the production of coated turbine blades, such improved control of the chromium content of the coating is highly advantageous in terms of providing a more reliable, higher quality product.

Although the invention has been shown and described with respect to illustrative embodiments thereof, it should be understood that other changes and additions in the form and detail thereof can be made. For example, two, three, four or more electron beam sources can be placed around the periphery of the molten pool as desired to more closely approximate the toroidal shaped heat input pattern. The electron beam sources and associated focusing and deflection means may be elevated above the crucible rather than being adjacent thereto. And, it may be desirable in some situations to use additional focusing and deflection means, including additional alternating current coil windings, to alter the beam impingement pattern.

Having thus described a typical embodiment of our invention, that which we claim as new and desire to secure by Letters Patent of the United States is:

1. In an electron beam vacuum vapor deposition apparatus wherein a molten pool is heated by electron beam impingement on the pool surface, having a plurality of electron beam sources spaced about the periphery of the molten pool and direct current focusing and deflection means associated with said sources for directing each electron beam onto the pool surface opposite its source, the improvement comprising:

the electron beams crossing paths at some point above the pool, alternating current deflection means disposed around the periphery of said molten pool between said sources and pool for causing each electron beam to impinge on the pool surface along a path shaped as an inwardly curved band relative to its source so that the impingement bands collectively create an approximate toroidal shaped beam heat input pattern at the pool surface, said toroidal heat input pattern being characterized as causing, along a diameter across the surface of the molten pool, a graphical heat intensity curve having maximum peaks located adjacent each end of the diameter with a central minimum valley therebetween.

2. The apparatus of claim 1 wherein each electron beam source is a linear emitter comprising a U-shaped filament adjacent a cathode body.

3. The apparatus of claim 1 wherein the direct current focusing and deflection means include direct current electro-magnets for directing each beam onto the pool surface opposite the source.

4. The apparatus of claim 3 wherein the alternating current deflection means further includes an alternating current coil winding concentric with the molten pool.

5. The apparatus of claim 1 wherein said plurality of electron beam sources comrises two electron beam sources spaced 180° apart about the periphery of the pool.

* * * * *